(12) United States Patent
Toyota et al.

(10) Patent No.: US 6,461,968 B1
(45) Date of Patent: *Oct. 8, 2002

(54) METHOD FOR FABRICATING A SEMICONDUCTOR DEVICE

(75) Inventors: Motohiro Toyota; Kenji Itoh, both of Matsusaka (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,994

(22) Filed: Jul. 30, 1999

(30) Foreign Application Priority Data

Aug. 5, 1998 (JP) .......................... 10-222144

(51) Int. Cl.$^7$ ............................... H01L 21/461
(52) U.S. Cl. .................. 438/706; 438/710; 438/712
(58) Field of Search .................. 438/706, 710, 438/712

(56) References Cited

U.S. PATENT DOCUMENTS

| 5,275,963 A | * | 1/1994 | Cederbaum et al. | .......... 437/48 |
| 5,312,717 A | * | 5/1994 | Sachdev | .................... 430/313 |
| 5,496,752 A | * | 3/1996 | Nasu et al. | .................... 437/41 |
| 5,654,237 A | * | 8/1997 | Suguro et al. | .............. 438/624 |
| 5,910,021 A | * | 6/1999 | Tabara | ........................ 438/636 |

FOREIGN PATENT DOCUMENTS

| JP | 10-68970 A | 3/1998 |
| JP | 10-268347 A | 10/1998 |

* cited by examiner

Primary Examiner—Benjamin L. Utech
Assistant Examiner—Vanessa Perez-Ramos
(74) Attorney, Agent, or Firm—Nixon & Vanderhye P.C.

(57) ABSTRACT

A method for fabricating a semiconductor device including a semiconductor layer structure, a source electrode and, a drain electrode formed on the semiconductor layer structure, and a source interconnection connected to the source electrode is provided. The method includes the steps of: (a) forming the semiconductor layer structure on a substrate; (b) forming a metal layer structure so as to cover the semiconductor layer structure; (c) forming a resist layer having a predetermined pattern on the metal layer structure: (d) performing a first etching process for the metal layer structure using the resist layer as a mask so as to form the source electrode, the drain electrode and the source interconnection; and (e) performing a second etching process for the semiconductor layer structure using the resist layer as a mask so as to form a transistor gap portion between the source electrode and the drain electrode. The respective first and second etching processes in the steps (d) and (e) are performed using the same resist layer as the mask in the same chamber.

8 Claims, 7 Drawing Sheets

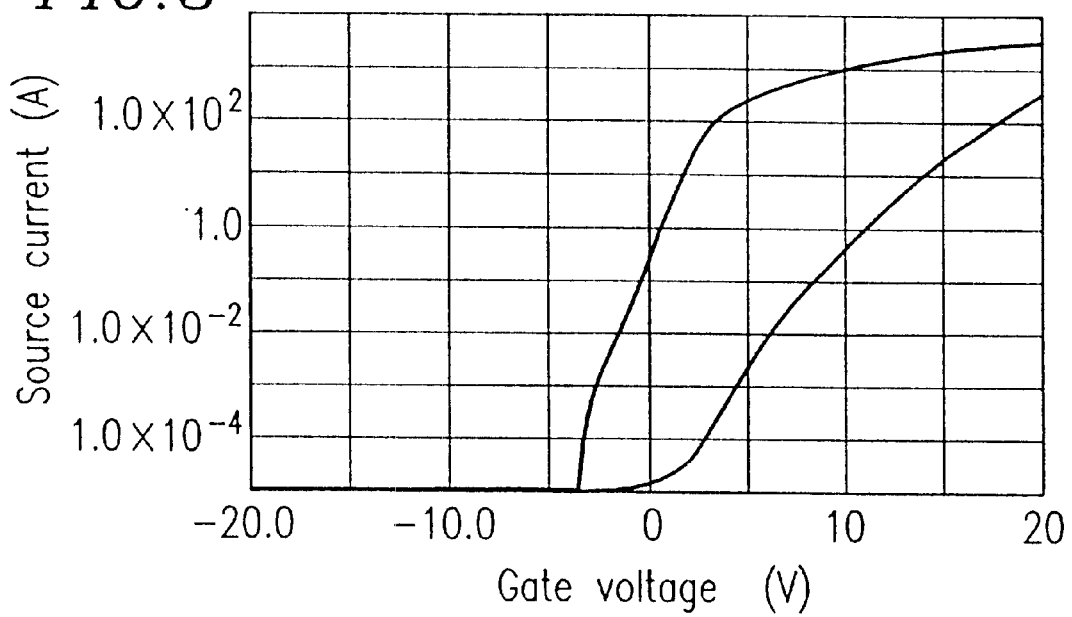

METHOD FOR FABRICATING A SEMICONDUCTOR DEVICE

BACKGROUND OF THE INVENTION

1. Field of the Invention

The present invention relates to a method for fabricating a semiconductor device, and more specifically, to a method for fabricating a TFT substrate to be used in a display device such as a liquid crystal display device.

2. Description of the Related Art

TFTs (thin film transistors) are used for driving a display device such as a liquid crystal display device.

FIG. 4 shows a partial plan view of a TFT substrate fabricated in accordance with a conventional fabrication method of a semiconductor device. FIGS. 5A to 5J show cross-sectional views each illustrating the process steps in the conventional fabrication method of the semiconductor device of FIG. 4. Among these drawings, FIG. 5J is a cross-sectional view taken along line X—X in FIG. 4, and FIGS. 5A to 5I show cross-sectional views at the corresponding position in the respective process steps.

As shown in FIGS. 4 and 5J, a TFT substrate 600 used in a liquid crystal display device includes a gate interconnection 63 patterned on a substrate 61, a gate insulating film 62 made of silicon nitride and formed on the entire surface of the substrate 61 so as to cover the gate interconnection 63, an intrinsic semiconductor layer 64 and an n-type semiconductor layer 65 sequentially deposited on the gate insulating film 62 in the shape of islands. The intrinsic semiconductor layer 64 and the n-type semiconductor layer 65 are in particular referred to as a semiconductor layer structure. Furthermore, a base layer 66 and a top layer 67 are provided as source interconnection materials (including a source electrode material and a drain electrode material) on the substrate 61 so as to cover the n-type semiconductor layer 65. The base layer 66 and the top layer 67 are in particular referred to as a metal layer structure.

In the TFT substrate 600, the base layer 66 and the top layer 67 form a source electrode 72, a drain electrode 73 and a source interconnection 74. A gap portion 71 for the transistor (hereinafter, referred to as "a transistor gap portion") is formed between the source electrode 72 and the drain electrode 73 so as to run through the top layer 67, the base layer 66 and the n-type semiconductor layer 65 and into the intrinsic semiconductor layer 64.

In the TFT substrate 600, ITO is used as a material of the base layer 66 of a source interconnection material. In the step of dry etching the top layer 67, the base layer 66 of ITO is not etched. Therefore, the etching is performed without affecting the underneath portion already formed below the ITO film 66 since the ITO film 66 functions as a barrier. Thus, the patterning of the source interconnection is commonly done by separately performing etching of the top layer 67 on the ITO film 66, etching of the ITO film 66, and etching of the n-type semiconductor layer 65 and the intrinsic semiconductor layer 64 to form the transistor gap portion 71.

Hereinafter, as a conventional fabrication method of the TFT substrate, a method of forming a source electrode, a drain electrode, a source interconnection (hereinafter, these are collectively referred to as "a source interconnection and the like"), and a transistor gap portion will be described with reference to FIGS. 5A to 5J.

As shown in FIG. 5A, the gate interconnection 63 is patterned in a predetermined pattern on the substrate 61, and the gate insulating film 62 is formed thereon. Then, the semiconductor layer structure including the intrinsic semiconductor layer 64 of amorphous silicon and the n-type semiconductor layer 65 of $N^+$ amorphous silicon are formed on the gate insulating film 62 in the shape of an island.

Next, as shown in FIG. 5B, the ITO film (base layer) 66 is formed on the resultant structure of FIG. 5A by sputtering or the like. Thereafter, the top layer 67 of a source interconnection material is formed on the resultant structure by sputtering or the like, as shown in FIG. 5C.

Next, a resist layer is provided on the top layer 67 by a spin coat method, or the like. The resist layer is then patterned by photolithography to form a first photoresist pattern 68, as shown in FIG. 5D.

Next, as shown in FIG. 5E, portions of the top layer 67 not covered by the first photoresist pattern 68 are removed by a chemical liquid treatment or dry etching. In this step, the first photoresist pattern 68 functions as a mask, so that the other portions of the top layer 67 covered with the first photoresist pattern 68 are unremoved. Furthermore, the entire underlying ITO film 66 is not substantially etched away because an etching select ion ratio thereof with respect to the top layer 67 is infinite. It should be noted that when the etching (patterning) of the top layer 67 is performed by dry etching in this step, etching residues (not shown) from the top layer 67 remain.

Next, as shown in FIG. 5F, the first photoresist pattern 68 is removed by a chemical liquid treatment. When the top layer 67 has been dry etched to be patterned in the previous step, the aforementioned etching residues are also removed by this chemical liquid treatment.

Next, another resist layer is provided on the patterned top layer 67 by a spin coat method or the like, and then patterned by a photolithography method so as to form a second photoresist pattern 69, as shown in FIG. 5G.

Next, as shown in FIG. 5H, portions of the ITO film 66 not covered by the second photoresist pattern 69 are removed by a chemical liquid treatment or dry etching. During this step, the second photoresist pattern 69 functions as a mask, so that the other portions of the ITO film 66 covered by the second photoresist pattern 69 are not removed. It should be noted that when the ITO film 66 is removed by dry etching in this step, etching residues (not shown) from the ITO film 66 are left on the n-type semiconductor layer 65.

Next, as shown in FIG. 5I, the second photoresist pattern 69 is removed by a chemical liquid treatment. When the ITO film 66 has been etched by dry etching to be patterned in the preceding step, the aforementioned etching residues are also removed by this chemical liquid treatment. Thus, a source interconnection and the like are formed.

Next, a portion of the $N^+$ amorphous silicon layer 65 is removed by dry etching. Furthermore, the amorphous silicon layer 64 is partly removed by dry etching at a position corresponding to the removed portion of the $N^+$ silicon layer 65. Finally, residues or the like generated during the above dry etching steps are removed by a chemical liquid treatment, thereby forming the transistor gap portion 71, as shown in FIG. 5J.

Thus, the TFT substrate 600 is fabricated.

In the above described conventional method for fabricating a TFT substrate, an ITO film is used for a base layer to be a source interconnection and the like. A top layer, which is to be a source interconnection and the like, is made of a metal material such as aluminum, an aluminum alloy, titanium, titanium compound including titanium nitride, chromium, tungsten, and a mixture thereof. An etchant for etching the top layer is selected in accordance with a material for the top layer. For example, when a material for the top layer is one of an aluminum-group material, a molybdenum-group material, and a tungsten-group material, a mixture of phosphoric acid, acetic acid and nitric acid, or the like is used. When a material for the top layer is a titanium-group material, hydrofluoric acid or the like is used. When a material for the top layer is a tantalum-group material, a mixture of hydrofluoric acid and nitric acid is used. Furthermore, a photoresist pattern functioning as a mask is made of a resin or the like.

In the step of etching the top layer made of the aforementioned material and provided above the ITO film, the portion of the underlying layered structure disposed below the ITO film is advantageously prevented from being etched because the etching selection ratio of the ITO film with respect to the top layer is infinite. However, as described above, it is necessary in the conventional art to separately perform etching of the top layer, etching of the base layer made of the ITO film, and etching of the transistor gap portion. These etching steps are accompanied by a number of photolithography steps. Therefore, there is a problem that many masks and process steps are required to be employed for the fabrication process.

It is preferable to perform the respective etching steps of the top layer, the base layer made of the ITO film, and the transistor gap portion by dry etching rather than a chemical liquid treatment in order to reduce the space required for the fabrication and simplify the fabrication process. Furthermore, dry etching is suitable for the subsequent etching to be performed for obtaining a very fine pattern.

Furthermore, in the aforementioned conventional fabrication method of the TFT substrate, the steps of removing the first photoresist pattern 68 and the second photoresist pattern 69 by a chemical liquid treatment are required as de scribed with reference to FIGS. 5A to 5J. One of the purposes of these steps is to remove the etching residues generated by the preceding dry etching.

Hereinafter, a case where the step of removing the second photoresist pattern 69 is omitted from the aforementioned fabrication process for the TFT substrate 600 for the purpose of reducing the number of fabrication steps will be described with reference to FIGS. 6A to 6C. Like components are designated by like reference numerals in FIGS. 5A to 5J and in FIGS. 6A to 6C, and the descriptions therefor will be omitted below.

The same fabrication steps as described with reference to FIGS. 5A to 5G are first performed. After these steps, as shown in FIG. 6A, portions of the ITO film 66 not covered by the second photoresist pattern 69 are etched away by dry etching. In this step, etching residues 70 from an ITO film 66 are left on the $N^+$ amorphous silicon layer 65.

When the transistor gap portion 71 (see FIG. 6C) is successively formed by etching after the etching of the ITO film 66 in the same chamber without removing the second photoresist pattern 69 and the etching residues 70 by a chemical liquid treatment, portions of the $N^+$ amorphous silicon layer 65 and the amorphous silicon layer 64 are left unetched to be in a pillar-like pattern corresponding to the positions of the etching residues 70, as seen in FIG. 6B. This is because the etching residues 70 function as a mask, thereby hindering the etching of the $N^+$ amorphous silicon layer 65 and the amorphous silicon layer 64.

Finally, the etching residues 70 and the second photoresist pattern 69 are removed by a chemical liquid treatment, thereby forming a transistor gap portion 71, as shown in FIG. 6C.

As described hereinbefore, the TFT substrate 600' is fabricated.

The portions of the semiconductor layer structure (including the $N^+$ amorphous silicon layer 65 and the amorphous silicon layer 64) which are left unetched to be in a pillar-like shape in the transistor gap portion 71 may cause a surface leakage current between the source electrode 72 and the drain electrode 73. Due to the surface leakage current, it is not possible to sufficiently reduce the OFF current of the transistor.

Furthermore, even in the case where the semiconductor layer structure is not left to be in a pillar-like shape (i.e., when any unetched portions of the semiconductor layer structure, if they exist, are undetectable at an SEM level) after the etching for forming the transistor gap portion 71, a minute amount of residue present in the transistor gap portion 71 causes undesirable electrical connections to be established by a later thermal aging process, whereby the OFF current of the resultant transistor increases gradually.

Thus, there is a need to etch away an area to be a transistor gap portion between a source electrode and a drain electrode such that substantially no residue remains. To this end, it is necessary to remove the residues after the etching of the base layer and before the etching of the transistor gap portion. Therefore, in order to realize such a purpose, a step of removing the etching residues by a chemical liquid treatment without deteriorating the TFT characteristics is essential in the conventional art.

SUMMARY OF THE INVENTION

According to the present invention, a method for fabricating a semiconductor device including a semiconductor layer structure, a source electrode and a drain electrode formed on the semiconductor layer structure, and a source interconnection connected to the source electrode is provided. The method includes the steps of: (a) forming the semiconductor layer structure on a substrate; (b) forming a metal layer structure so as to cover the semiconductor layer structure; (c) forming a resist layer having a predetermined pattern on the metal layer structure; (d) performing a first etching process for the metal layer structure using the resist layer as a mask so as to form the source electrode, the drain electrode and the source interconnection; and (e) performing a second etching process for the semiconductor layer structure using the resist layer as a mask so as to form a transistor gap portion between the source electrode and the drain electrode. The respective first and second etching processes in the steps (d) and (e) are performed using the same resist layer as the mask in the same chamber.

In one embodiment, the resist layer is a photoresist layer, and the respective first and second etching processes in the steps (d) and (e) are successively performed using the same resist layer as the mask in the same chamber by reactive ion etching.

The first etching process for the metal layer structure in the steps (d) may be performed under a gas pressure of about 10 mTorr or less.

The method may further include, between the steps (d) and (e), a step (f) of performing a middle treatment process in which the substrate is subjected to reactive ion etching with a mixed gas of $CF_4$ and $O_2$ using the resist layer as a mask in the same chamber.

The method may further include, after the step (e), a step (g) of performing a damage treatment process in which the substrate is subjected to plasma etching using the resist layer as a mask.

In one embodiment, the metal layer structure contains Ti: and the first etching process for the metal layer structure in the step (d) is performed with a mixed gas of $Cl_2$ and $BCl_3$.

In one embodiment, the second etching process for the semiconductor layer structure in the step (e) is performed with a $Cl_2$ gas.

The method may further include, between the steps (e) and (g), a step (h) of performing an after-treatment process in which the substrate is subjected to reactive ion etching with a mixed gas of $CF_4$ and $O_2$ using the resist layer as a mask in the same chamber.

Hereinafter, the function of the present invention will be described.

In the method for fabricating a semiconductor device of the present invention, the etching is performed through the metal layer structure so as to reach the inside of the semiconductor layer structure with the same etching pattern. Therefore, a source electrode, a drain electrode, a source interconnection and a transistor gap portion can be formed with a single etching pattern (mask). Accordingly, the smaller number of photolithography steps is to be performed, thereby simplifying the fabrication process.

According to a preferred embodiment of the present invention, the respective dry etching steps by reactive ion etching for the metal layer structure and the semiconductor layer structure are successively performed in the same chamber. Thus, a method for forming the source electrode, the drain electrode, the source interconnection and the transistor gap portion can be performed in a smaller space and with a reduced number of steps.

According to a preferred embodiment of the present invention, a step of performing a middle treatment, in which a substrate is subjected to reactive ion etching, is performed between a step of etching the metal layer structure and a step of etching the semiconductor layer structure. Thus, the etching residues from the metal layer structure can be removed, and as a result, the formation of pillar-like semiconductor portions in an area to be the transistor gap portion can be prevented. Accordingly, a surface leakage current is prevented from increasing, so that desirable TFT characteristics can be maintained.

According to a preferred embodiment of the present invention, a step of performing a damage treatment, in which the substrate is subjected to plasma etching, is further performed after the step of etching the semiconductor layer structure. Thereby, a damaged layer at the transistor gap portion generated by reactive ion etching can be removed, and as a result, damages of the transistor gap portion can be reduced. Thus, TFT characteristics can be improved.

According to a preferred embodiment of the present invention, a step of performing an after-treatment for the substrate, in which the substrate is subjected to reactive ion etching with a mixed gas of $CF_4$ and $O_2$, is further performed after the step of etching the semiconductor layer structure. Thus, chlorine remaining on the substrate can be removed by the $CF_4$ gas, and a resist layer can be ashed with the $O_2$ gas.

Thus, the invention described herein makes possible the advantages of providing a method for fabricating a semiconductor device in which a fabrication process is shortened without deteriorating the TFT characteristics.

This and other advantages of the present invention will become apparent to those skilled in the art upon reading and understanding the following detailed description with reference to the accompanying figures.

BRIEF DESCRIPTION OF THE DRAWINGS

FIG. 3 shows graphs illustrating static characteristics of the TFT substrate fabricated in accordance with a fabrication method of the semiconductor device of the present invention.

DESCRIPTION OF THE PREFERRED EMBODIMENTS

Hereinafter, an embodiment of the present invention will be described with reference to the drawings.

Figure 1:
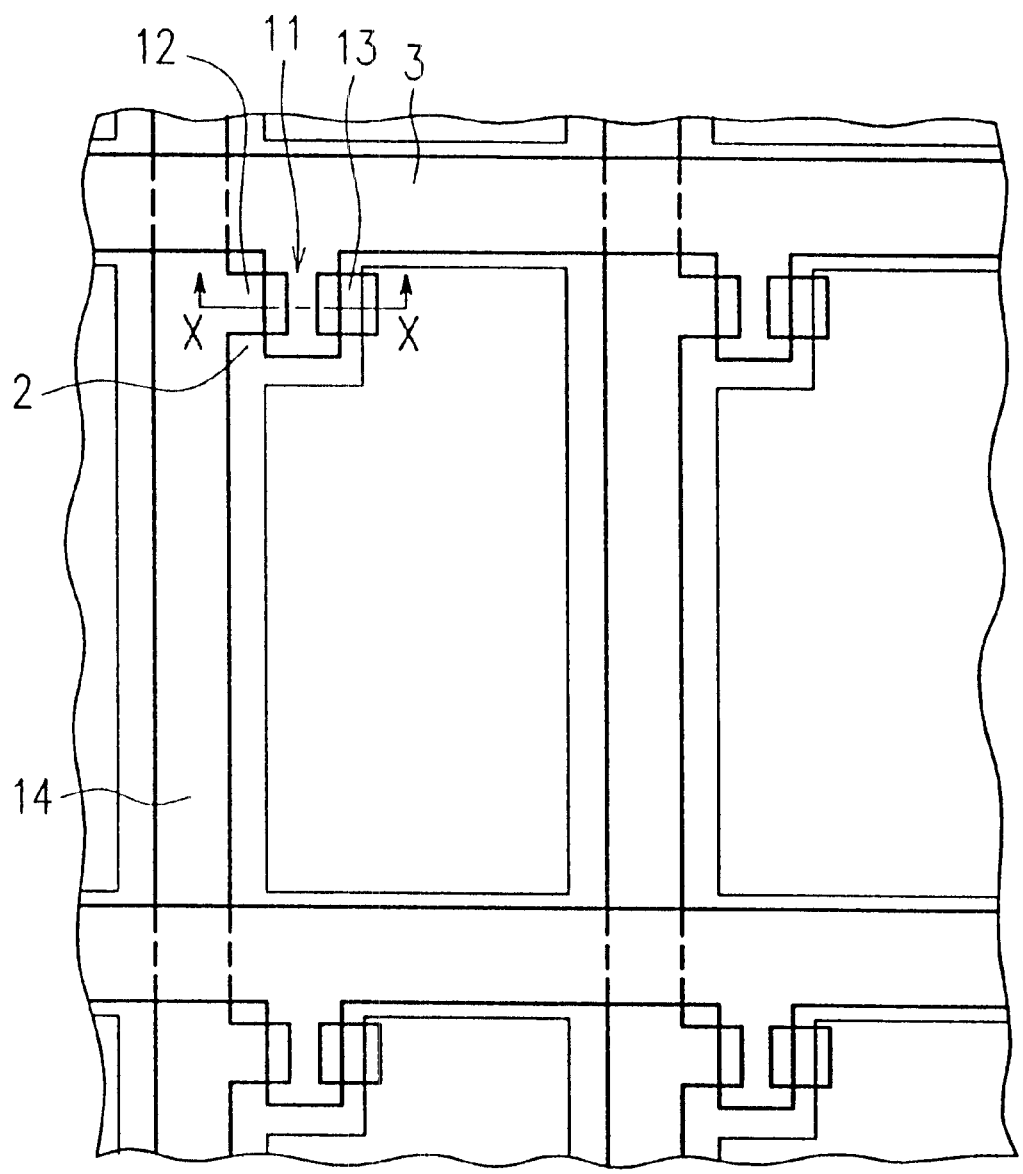
FIG. 1 shows a partial plan view of a TFT substrate fabricated in accordance with a fabrication method of a semiconductor device according to the present invention.

FIG. 1 shows a partial plan view of a TFT substrate fabricated in accordance with a fabrication method of a semiconductor device of the present invention. FIGS. 2A to 2G show cross-sectional views each illustrating the process steps in the fabrication method of the semiconductor device of FIG. 1 according to the present invention. Among these drawings, FIG. 2G is a cross-sectional view taken along line X—X in FIG. 1, and FIGS. 2A to 2F show cross-sectional views at the corresponding position in the respective process steps.

Figure 5A:
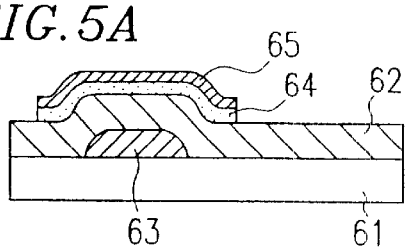
FIGS. 5A to 5J show cross-sectional views each illustrating the process steps in the conventional fabrication method of a semiconductor device.
Figure 5B:
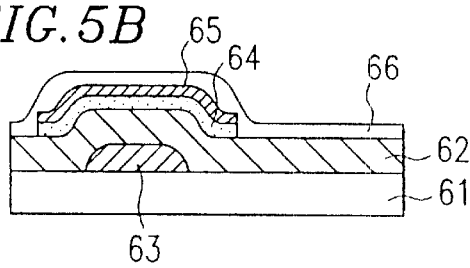
Figure 5C:
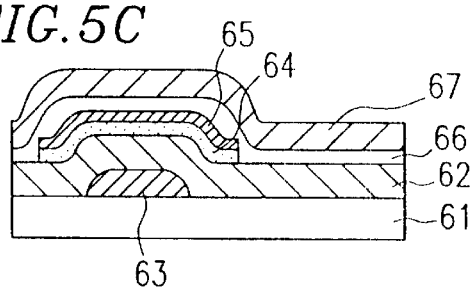
Figure 5D:
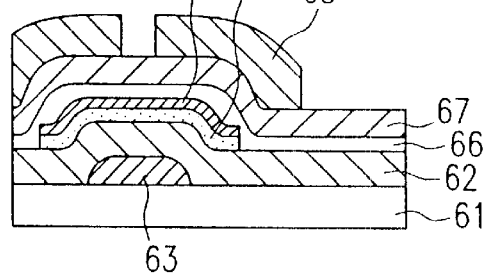
Figure 5E:
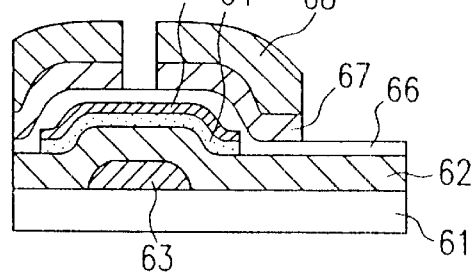
Figure 5F:
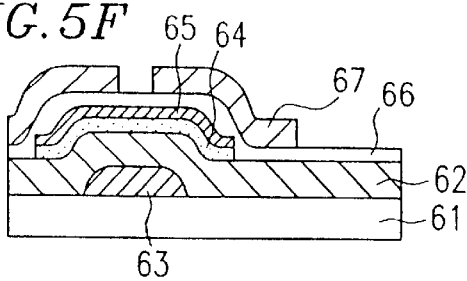
Figure 5G:
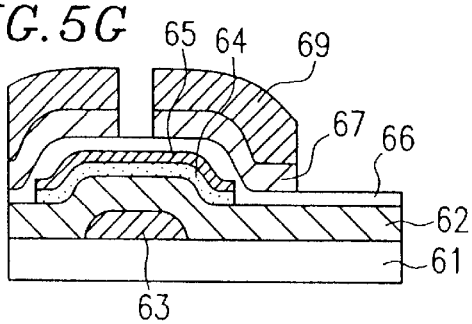
Figure 5H:
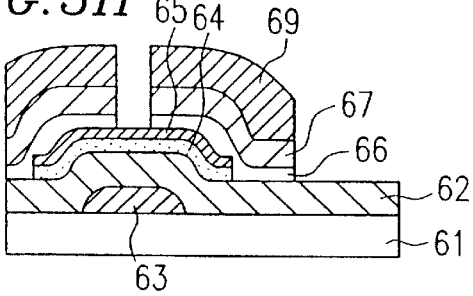
Figure 5I:
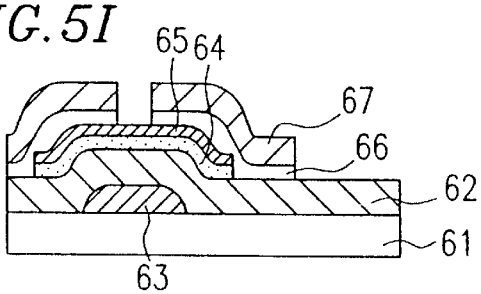
Figure 5J:
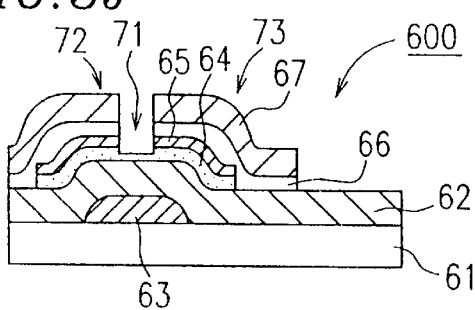
Figure 6A:
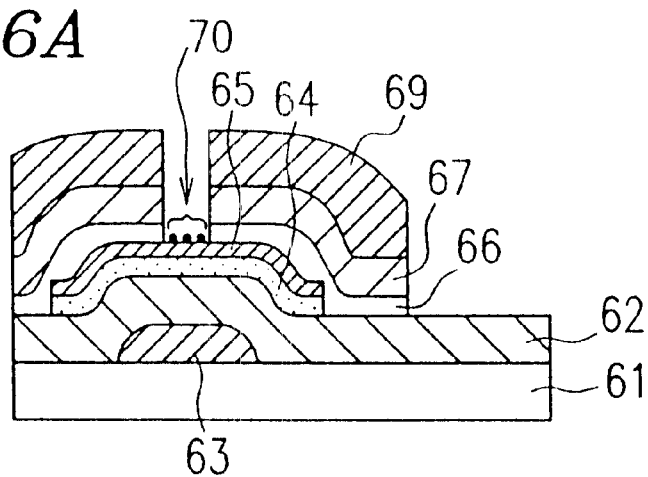
FIGS. 6A to 6C show cross-sectional views each illustrating the process steps in another conventional fabrication method of a semiconductor device.
Figure 6B:
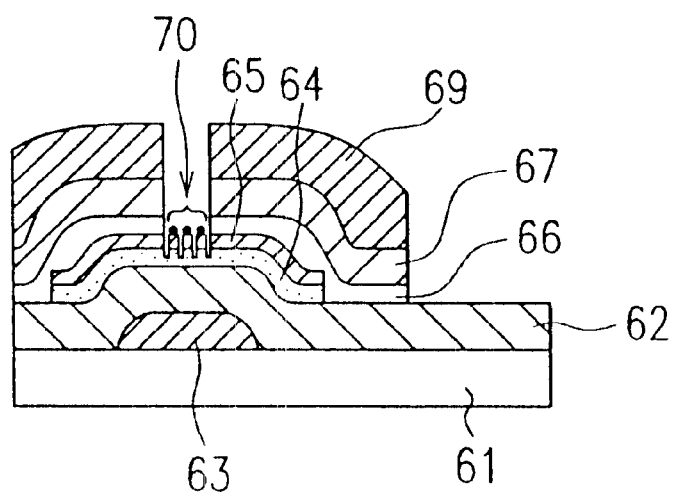
Figure 6C:
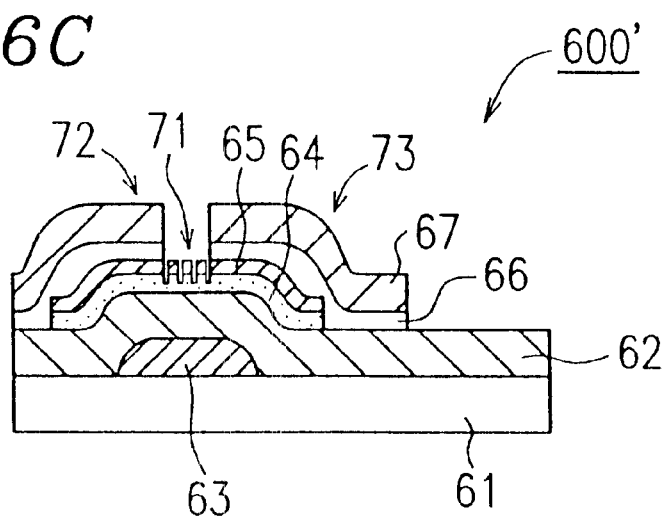

As shown in FIGS. 1 and 2G, a TFT substrate 100 fabricated according to a method for fabricating a semiconductor device of the present invention has a structure similar to that of the TFT substrate 600 as described with reference to FIG. 5J fabricated according to the conventional method. Specifically, the TFT substrate 100 includes gate interconnection 3 patterned on a substrate 1, a gate insulating film 2 formed on the entire surface of the substrate 1 so as to cover the gate interconnection 3, a semiconductor layer structure which includes an intrinsic semiconductor layer 4 and an ntype semiconductor layer 5 sequentially deposited on the gate insulating film 2 in the shape of an island, a metal layer structure which includes a base layer 6 and a top layer 7 provided as source interconnection material layers (including a source electrode material and a drain electrode material) on the substrate 1 so as to cover the n-type semiconductor layer 5. In the TFT substrate 100, the base layer 6 and the top layer 7 form a source electrode 12, a drain electrode 13 and a source interconnection 14. Between the source electrode 12 and the drain electrode 13, a transistor gap portion 11 is formed so as to run through the top layer 7, the base layer 6 and the n-type semiconductor layer 5 and into the intrinsic semiconductor layer 4.

In the TFT substrate 100 having such a structure, a material to be used for the base layer 6 of the source interconnection material is not ITO as conventionally used. A material for the metal layer structure including the base layer 6 and the top layer 7 is preferably a metal material selected from a group consisting of aluminum, an aluminum alloy, titanium, a titanium compound including titanium nitride, a titanium alloy, tantalum, a tantalum compound including tantalum nitride, a tantalum alloy, chromium, and a mixture thereof. In the present embodiment, the base layer 6 is made of titanium.

The present embodiment uses a metal layer structure including the two layers, but is not limited thereto. Furthermore, the metal layer structure may include a single layer, or a multilayer structure with three layers or more.

Examples of a semiconductor material suitable for the intrinsic semiconductor layer 4 and an n-type semiconductor layer 5 include amorphous silicon, microcrystalline silicon and the like. Examples of suitable materials for the gate interconnection 3 include metal materials such as aluminum, an aluminum alloy, titanium, a titanium compound including titanium nitride, a titanium alloy, tantalum, a tantalum compound including tantalum nitride, a tantalum alloy, chromium, and a mixture thereof. Examples of suitable materials for the gate insulating film 2 include silicon nitride, an anodic oxidation film of the above-mentioned gate interconnection material and the like. In the present embodiment, amorphous silicon and phosphorus-doped microcrystalline silicon are used for the intrinsic semiconductor layer 4 and the n-type semiconductor layer 5, respectively. Furthermore, silicon nitride and a layered film of tantalum nitride and tantalum (TaN/Ta/TaN) are used for a gate insulating film 2 and a gate interconnection 3, respectively.

Hereinafter, as a fabrication method of the TFT substrate according to the present invention, a method for forming a source electrode, a drain electrode, a source interconnection (hereinafter, these are collectively referred to as "a source interconnection and the like"), and a transistor gap portion will be described with reference to FIGS. 2A to 2G.

First, the gate interconnection 3 is patterned in a predetermined pattern on the substrate 1, and the gate insulating film 2 is formed thereon. Then, the semiconductor layer structure including the intrinsic semiconductor layer 4 of amorphous silicon and the ntype semiconductor layer 5 of microcrystalline silicon is formed on the gate insulating film 2 in the shape of an island. As a result, a layered structure as shown in FIG. 2A is obtained.

Figure 2A:
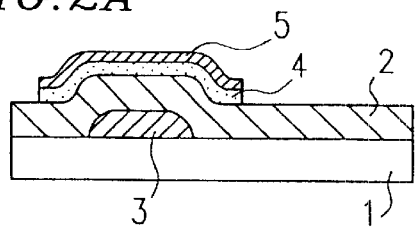
FIGS. 2A to 2G show cross-sectional views each illustrating the process steps in the fabrication method of a semiconductor device according to the present invention.
Figure 2B:
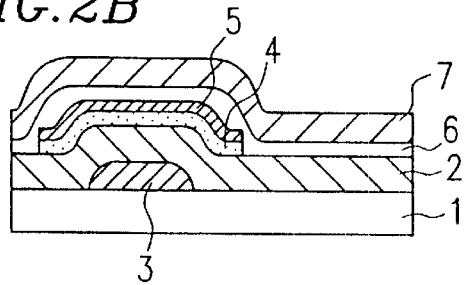

Next, as shown in FIG. 2B, the metal layer structure including the base layer 6 and the top layer 7 made of a source interconnection material is formed on the resultant structure of FIG. 2A by sputtering or the like.

Figure 2C:
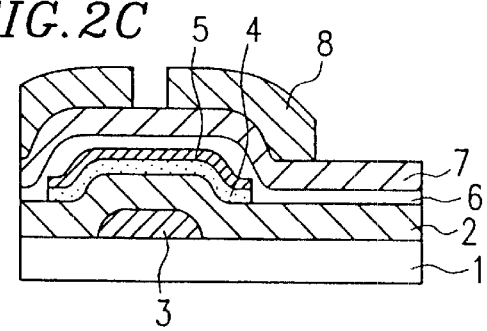

Next, a material such as a resin is applied on the top layer 7 to form a resist layer. The resist layer is then patterned by photolithography to form a photoresist pattern 8, as shown in FIG. 2C.

Thereafter, as shown in FIGS. 2D to 2G, the etching steps for the metal layer structure (the top layer 7 and the base layer 6) and the phosphorus-doped microcrystalline silicon layer 5 to reach the inside of the amorphous silicon layer 4 (which involve the first through fourth dry etching steps as set forth below) are successively performed in a plasma dry etching apparatus based on the reactive ion etching (RIE) system.

The RIE system refers to a reactive ion etching utilizing an ion sheath area in radio frequency (RF) plasma. Since this system utilizes an impact of ions, the etching rate thereof is generally fast. Therefore, the system is suitable for etching metals, but likely to damage the device.

Hereinafter, the successive etching process for the top layer 7, the base layer 6, the phosphorus-doped microcrystalline silicon layer 5, and the amorphous silicon layer 4 will be described in more detail.

Figure 2D:
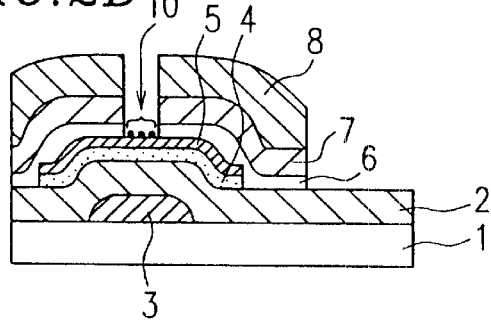

In the present embodiment, the conditions for a first dry etching step are set such that: a gas pressure is about 9 mTorr; a flow rate of a $Cl_2$ gas is about 30 sccm; a flow rate of a $BCl_3$ gas is about 170 sccm; an RF frequency is about 13.56 MHz; an RF power is about 2000 W; an electrode temperature is about 60° C.; and a discharge period is controlled by an EPD (end point detector) so that the discharge ends when the etching reaches the bottom of the base layer (TiN layer) 6. Under these conditions, portions of the top layer 7 and the base layer 6 are etched away so as to form a source interconnection, as shown in FIG. 2D. As a result, etching residues 10 from the base layer 6 are left on the phosphorus-doped microcrystalline silicon layer 5.

The above-mentioned first dry etching for the top layer 7 and the base layer 6 (i.e., the etching for the metal layer structure) is preferably performed under a gas pressure of about 10 mTorr or less for the following reason. In a low pressure region of about 10 mTorr or less, an enhanced effect of the dry etching process (e.g., a reactive ion etching process) can be obtained. Thus, when the metal layer structure is dry-etched in such a low pressure region of about 10 mTorr or less, generation of the etching residues 10 can be suppressed to the minimum level.

Figure 2E:
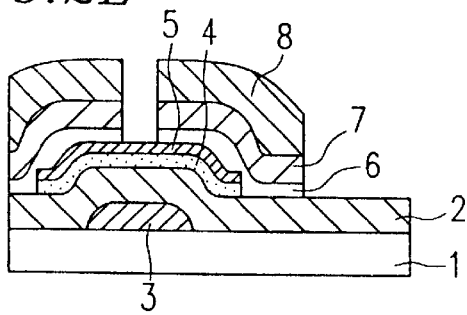

The conditions for a subsequent second dry etching step are set such that: a gas pressure is about 25 mTorr; a flow rate of a $CF_4$ gas is about 50 sccm; a flow rate of a $O_2$ gas is about 160 sccm; an RF power is about 2500 W; an electrode temperature is about 60° C.; and a discharge period is about 180 seconds. Under these conditions, as shown in FIG. 2E, the middle treatment is performed by reactive ion etching. By this second etching step (i.e., the middle treatment), the etching residues 10 generated when the base layer 6 was dry etched are removed. Therefore, in subsequent etching steps, the semiconductor layer structure including the phosphorus-doped microcrystalline silicon layer 5 and the amorphous silicon layer 4 in an area to be a transistor gap portion 11 (see FIG. 2F) are prevented from being left unetched to be in a pillar-like shape. Thus, a surface leakage component can be eliminated, and the OFF current in the TFT characteristics can be reduced.

A gas used in the step of removing the etching residues 10 is preferably selected from a group consisting of an oxygen gas, a fluorine-type gas, and a mixture thereof. Examples of the fluorine-type gases include, for example, $CF_4$, $SF_6$, $CHF_3$ and the like. The amount of the fluorine-type gas is preferably about 20% to about 25% with respect to the total amount of the fluorine-type gas and an oxygen gas.

Figure 2F:
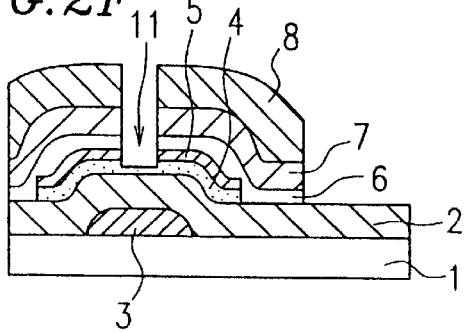
Figure 2G:
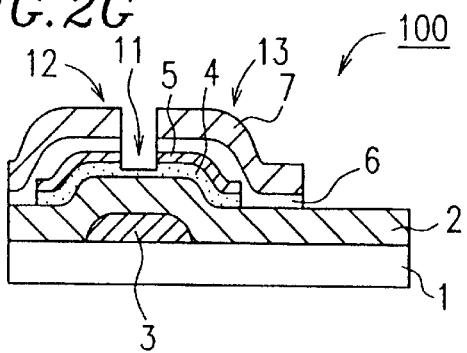
Figure 4:
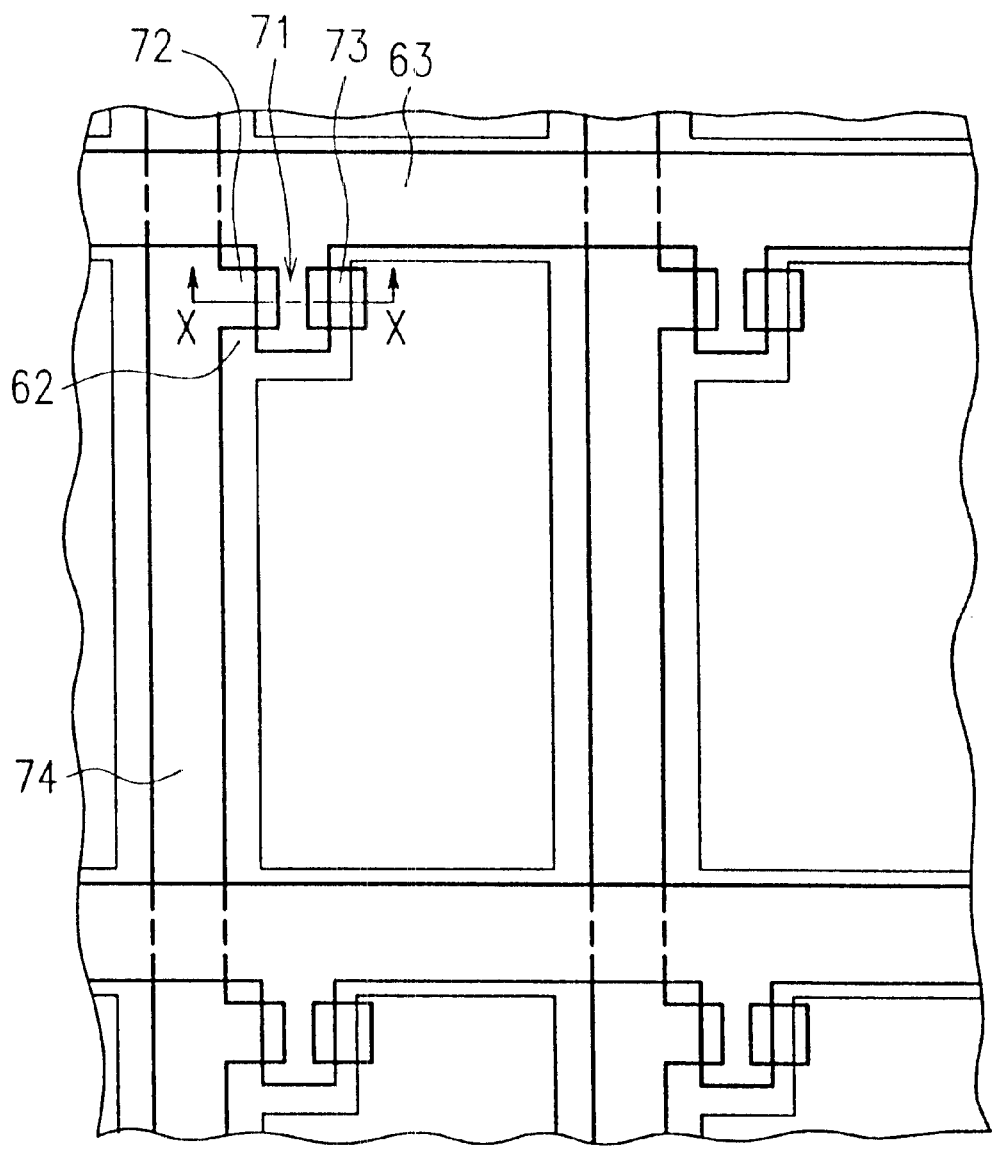
FIG. 4 shows a partial plan view of a TFT substrate fabricated in accordance with a conventional fabrication method of a semiconductor device.

The conditions for a subsequent third dry etching step are set such that: a gas pressure is about 25 mTorr; a flow rate of a $Cl_2$ gas is about 250 sccm; an RF power is about 2500 W; an electrode temperature is about 60° C.; and a discharge period is about 35 seconds. Under these conditions, the etching is performed through the phosphorus-doped microcrystalline silicon layer 5 to reach the inside of the amorphous silicon layer 4 so as to form a transistor gap portion 11, as shown in FIG. 2F. A gas used in the step of forming the transistor gap portion 11 is preferably selected from a group consisting of a $Cl_2$ gas, a $BCl_3$ gas, an HCl gas, and a mixture thereof. In the formation step of the transistor gap portion 11, a reactive ion etching method using chlorine gases is preferably used in order to minimize the etching for an exposed surface of the gate insulating film 2 of silicon nitride ($SiN_x$) around the island.

The conditions for a subsequent fourth dry etching step are set such that: a gas pressure is about 25 mTorr;

a flow rate of a $CF_4$ gas is about 10 sccm; a flow rate of an $O_2$ gas is about 200 sccm; an RF power is about 2500 W;

an electrode temperature is about 60° C.; and a discharge period is about 60 seconds. Under these conditions, the after-treatment is performed by reactive ion etching. By this fourth etching step (i.e., the after-treatment), chlorine remaining on the substrate is removed, and a surface of the photoresist pattern 8 is ashed with oxygen. The fourth dry etching as the after-treatment is preferably performed after the above-described preceding dry etching step with a chlorine gas so as to expose the resultant structure to $CF_4+O_2$ plasma, both for the purpose of removing the residual chlorine on the substrate and for the purpose of ashing the resist surface with $O_2$ plasma.

Thus, the above-explained four dry etching steps are successively performed in the same chamber of the dry etching apparatus while using the same photoresist pattern 8. As described above, the respective etching steps for the base layer 6, the phosphorus-doped microcrystalline silicon layer 5 and the amorphous silicon layer 4 can be successively performed in the same chamber by dry etching, thereby reducing the space and the number of steps required for the fabrication of the semiconductor device.

In the present embodiment, the top layer 7 and the base layer 6 are simultaneously etched by dry etching. However, the top layer 7 may be etched by a chemical liquid treatment. Examples of an etchant (chemical liquid) for etching the top layer 7 include a mixture of phosphoric acid, acetic acid, and nitric acid and the like.

Next, the resultant structure is subjected to a damage treatment, in which the structure is subjected to plasma etching using a plasma dry etching apparatus based on a plasma etching (PE) system. The plasma etching (PE) system refers to the plasma etching to be performed substantially only by a chemical reaction without using an ion sheath region of RF plasma. Since this system does not utilize an impact of ions, the etching rate is generally low, but the damage to the device is small. With the plasma etching based on the low-damage PE system, a damaged layer of the transistor gap portion 11, which is generated by the preceding successive etching steps based on the above-described RIE system, is removed, thereby reducing the damage to the transistor gap portion 11. Thus, the TFT characteristics can be improved.

In the present embodiment, the dry etching conditions for the above-described plasma etching as the damage treatment are set such that: a gas pressure is about 100 mTorr; a flow rate of a HCl gas is about 300 sccm: a flow rate of an $SF_6$ gas is about 300 sccm; an RF frequency is about 13.56 MHz: an RF power is about 300 W: an electrode temperature is about 60° C.; and a discharge period is about 30 seconds.

In the present embodiment, the above-mentioned plasma etching for the damage treatment is performed with an apparatus different from the apparatus for the preceding successive etching steps. However, the present invention is not limited thereto as long as the above-described object is achieved.

Finally, as shown in FIG. 2G, the photoresist pattern 8 is removed by a chemical liquid treatment using an etchant such as a mixture of amine solvents or the like. Thus, the TFT substrate 100 is fabricated.

According to the above-described fabrication method of the present invention, a TFT substrate 100 can be fabricated with using only a single etching pattern (mask) 8, thereby reducing the number of fabrication steps.

The TFT characteristics of the TFT substrate 100 fabricated according to the present invention are shown in FIG. 3. A liquid crystal panel using this TFT substrate 100 has a source current of about 0.1 pA or less when the gate is OFF (a gate voltage is about −10 V), as shown in FIG. 3.

As a comparative example, a TFT substrate is fabricated in the same manner as the above-described embodiment of the present invention, except that the second dry etching step (the middle treatment step) for removing the etching residues 10 is omitted from the successive etching steps for the base layer 6, the phosphorus-doped microcrystalline silicon layer 5 and the amorphous silicon layer 4.

Figure 7:
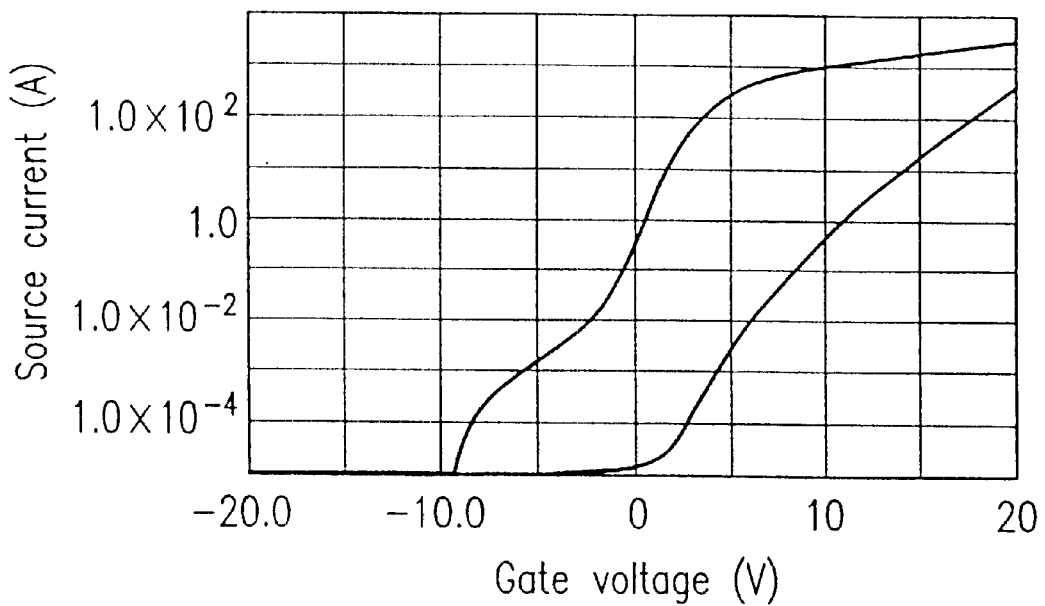
FIG. 7 shows graphs illustrating static characteristics of the TFT substrate fabricated in accordance with a comparative fabrication method of the semiconductor device.

The TFT characteristics of the thus-fabricated comparative TFT substrate are shown in FIG. 7. A liquid crystal panel using this comparative TFT substrate has a source current of 1 pA or more when a gate is OFF (a gate voltage is about −10 V), as shown in FIG. 7. In comparison with the TFT substrate fabricated according to the present invention (see FIG. 3), a leakage current on the surface of the comparative substrate is much larger, and the TFT characteristics are deteriorated.

Thus, according to the fabrication method of the present invention, a TFT substrate having superior TFT characteristics with a significantly reduced surface leakage current, as shown in FIG. 3, can be fabricated.

According to a method for fabricating a semiconductor device of the present invention, a source electrode, a drain electrode, a source interconnection, and a transistor gap portion can be fabricated with only a single etching pattern (mask). Therefore, the fabrication process is significantly simplified. Furthermore, a metal layer structure including a base layer and a semiconductor layer having a transistor gap portion can be successively etched in the same chamber. Furthermore, the number of steps in the fabrication process of the TFT substrate according to the present invention (from the resist application step to the final etching step) is reduced to about ⅓ of that of a conventional, fabrication process. Therefore, the throughput of the fabrication can be significantly improved. Thus, the present invention provides a method for fabricating a semiconductor device which is performed in a smaller space and with a smaller number of fabrication steps without deteriorating the TFT characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device including a semiconductor layer structure, a source electrode and a drain electrode formed on the semiconductor layer structure, and a source interconnection connected to the source electrode, the method comprising the steps of:

(a) forming the semiconductor layer structure on a substrate;

(b) forming a metal layer structure so as to cover the semiconductor layer structure;

(c) forming a resist layer having a pattern on the metal layer structure;

(d) performing a first etching process for the metal layer structure using the resist layer as a mask so as to form the source electrode, the drain electrode and the source interconnection under low gas pressure so as to suppress generation of etching residues; and (e) performing a second etching process for the semiconductor layer structure using the resist layer as a mask so as to form a transistor gap portion between the source electrode and the drain electrode;

wherein the respective first and second etching processes in the steps (d) and (e) are performed using the same resist layer as the mask in the same chamber (f) performing a middle treatment process, between the steps (d) and (e), in which the substrate is subjected to reactive ion etching with a mixed gas of $CF_4$ and $O_2$ using the resist layer as a mask in the same chamber to remove the etching residues of metal and to lower a leak current of an OFF time of the semiconductor device.

2. A method for fabricating a semiconductor device according to claim 1, wherein the resist layer is a photoresist layer; and the respective first and second etching processes in the steps (d) and (e) are successively performed using the same resist layer as the mask in the same chamber by reactive ion etching.

3. A method for fabricating a semiconductor device according to claim 1, wherein, the first etching process for the metal layer structure in the steps (d) is performed under a gas pressure of about 10 mTorr or less.

4. A method for fabricating a semiconductor device according to claim 1, further comprising, between the steps (d) and (e), a step (f) of performing a middle treatment process in which the substrate is subjected to reactive ion etching with a mixed gas of $CF_4$ and $O_2$ using the resist layer as a mask in the same chamber.

5. A method for fabricating a semiconductor device according to claim 1, further comprising, after the step (e), a step (g) of performing a damage treatment process in which the substrate is subjected to plasma etching using the resist layer as a mask.

6. A method for fabricating a semiconductor device according to claim 1, wherein:

the metal layer structure contains Ti; and the first etching process for the metal layer structure in the step (d) is performed with a mixed gas of $Cl_2$ and $BCl_3$.

7. A method for fabricating a semiconductor device according to claim 1, wherein the second etching process for the semiconductor layer structure in the step (e) is performed with a $Cl_2$ gas.

8. A method for fabricating a semiconductor device according to claim 5, further comprising, between the steps (e) and (g), a step (h) of performing an after-treatment process in which the substrate is subjected to reactive ion etching with a mixed gas of $CF_4$ and $O_2$ using the resist layer as a mask in the same chamber.

* * * * *